United States Patent [19]

Wang et al.

[11] Patent Number: 5,567,658
[45] Date of Patent: Oct. 22, 1996

[54] METHOD FOR MINIMIZING PEELING AT THE SURFACE OF SPIN-ON GLASSES

[75] Inventors: Chin-Kun Wang, Shan-Chung; Cheng-Cheng Chang, Chu-Dong, both of Taiwan

[73] Assignee: Taiwan Semiconductor Manufacturing Company, Ltd., Hsin-Chu, Taiwan

[21] Appl. No.: 299,269

[22] Filed: Sep. 1, 1994

[51] Int. Cl.[6] ............... H05H 1/00; H01L 21/4757; H01L 21/469
[52] U.S. Cl. ............... 437/228; 437/231; 437/235; 437/238; 427/535; 427/539; 204/179; 134/1.1; 134/1.2; 156/643.1; 156/646.1
[58] Field of Search ............... 437/231, 228, 437/225, 235, 238; 204/179, 164; 427/535, 539; 134/1.1, 1.2; 156/643.1, 646.1

[56] References Cited

U.S. PATENT DOCUMENTS

| | | | |
|---|---|---|---|
| 5,270,259 | 12/1993 | Ito et al. | 437/235 |
| 5,270,267 | 12/1993 | Ouellet | 437/231 |
| 5,290,399 | 3/1994 | Reinhardt | 156/655 |
| 5,316,980 | 5/1994 | Takeshiro | 437/228 |
| 5,366,910 | 11/1994 | Ha et al. | 437/40 |
| 5,376,590 | 12/1994 | Machida et al. | 437/235 |
| 5,399,533 | 3/1995 | Pramanik et al. | 437/228 |
| 5,413,963 | 5/1995 | Yen et al. | 437/195 |
| 5,429,988 | 7/1995 | Huang et al. | 437/187 |

FOREIGN PATENT DOCUMENTS

| | | | |
|---|---|---|---|
| 62-221120 | 9/1987 | Japan | H01L 21/88 |
| 1145835 | 6/1989 | Japan | H01L 21/90 |
| 2106948 | 4/1990 | Japan | H01L 21/90 |
| 4199625 | 7/1992 | Japan | H01L 21/318 |

*Primary Examiner*—Robert Kunemund
*Assistant Examiner*—Matthew Whipple
*Attorney, Agent, or Firm*—George O. Saile

[57] ABSTRACT

A gas discharge through nitrous oxide or nitrogen is used to remove polymeric deposits that form on the surface of a layer of a spin-on glass that was etched in an atmosphere of carbon-fluorine compounds. Removal of the polymeric deposit greatly improves adhesion to the spin-on glass layer of subsequently deposited layers. The removal is accomplished without increasing any tendency of the spin-on glass layer to absorb moisture.

28 Claims, 2 Drawing Sheets

METHOD FOR MINIMIZING PEELING AT THE SURFACE OF SPIN-ON GLASSES

BACKGROUND OF THE INVENTION

1. FIELD OF THE INVENTION

The present invention relates to a method for cleaning the surface of a spin-on glass layer that has been subjected to an etching procedure. A particular feature of the invention is that it accomplishes the surface cleaning without introducing undesireable side effects such as an increase in the porosity of the spin-on glass layer.

2. DESCRIPTION OF THE PRIOR ART

The general class of compounds known as siloxanes have a chemical structure of the form:

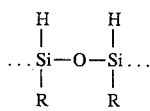

where R represents a hydrocarbon radical such as $CH_3$ or $C_2H_5$.

Spin-on glasses are created by dissolving a siloxane in a suitable solvent, such as methyl alcohol, adjusting the concentration of the solution so as to obtain the right viscosity, and then applying the solution to the surface of a semiconductor wafer so as to form a layer of a predetermined thickness. Thickness is controlled by dripping a measured amount of the solution onto the surface of a spinning wafer in the same way that photoresist is applied. The layer of siloxane solution is then allowed to dry, following which it is subjected to heat treatment (approximately 420° C. for approximately 30 minutes) in an nitrogen ambient. During this heat treatment the Si in the siloxane is converted to $SiO_2$.

Although the polymerization reaction goes to completion for the bulk of the siloxane material, small amounts of unoxidized radicals, R, (typically $CH_3$) tend to remain behind, trapped inside the $SiO_2$ film that was created by the Oxidizing heat treatment. Such trapped $CH_3$ radicals would not necessarily be a problem were it not for the fact that many applications of spin-on glasses in semiconductor technology require that the newly created $SiO_2$ film (or cured SOG) be etched back by some predetermined amount after it has been created.

Etch-back of the cured SOG layer is generally performed by means of reactive ion etching, typically involving a gaseous atmosphere that contains carbon-fluorine compounds such as $CF_4$ or $CHF_3$. As the cured SOG layer is etched away the trapped $CH_3$ radicals become exposed to etchant gas and some of them react with it to produce a polymer-like material which manifests itself as a thin residue or scum on the surface of the etched-back SOG.

Following the etch back procedure, the next step in the manufacture of the integrated circuit would be to deposit an additional layer of insulating or conductive material onto the surface of the etched-back SOG. If the polymeric residue that resulted from the reaction of the $CH_3$ radicals with the etchant gas is allowed to remain on the surface of the cured SOG prior to the application of the additional layers, a problem will arise as the presence of the residue will eventually lead to a loss of adhesion between the top surface of the SOG and the layer that has been deposited directly onto it. This loss of adhesion leads to bubbling and/or peeling of all the layers that were deposited onto the etched back surface of the SOG.

A number of methods are currently in use for dealing with this problem, but none of them is completely satisactory:

a) Reactive ion etching in a mixture of $CF_4$ and oxygen. Only limited improvement is obtained with this method and the microloading effect is enhanced. That is, the SOG etch rate becomes very dependent on the amount of exposed plasma-enhanced oxide at any given time.

b) Raising the temperature at the lower electrode of the etcher. The improvement is slight and etching uniformity is degraded.

c) Oxygen plasma treatment. This method is difficult to control. A slight over-treatment readily results in a cracked and/or porous SOG film in which moisture absorption increases drastically.

d) Argon sputtering. This method leads to a loss in planarity because of the difference in the sputtering rate of the SOG and the plasma enhanced oxide (PE oxide).

SUMMARY OF THE INVENTION

A principal object of the present invention is to provide an effective method for removing the polymeric scum that is formed on the surface of a layer of a spin-on glass that has been etched back in an etchant that contains compounds of carbon and fluorine, Another object of the present invention is to remove polymeric scum formed on the surface of a spin-on glass layer during etch-back without, at the same time, increasing the moisture absorption capacity of the spin-on glass layer.

In accordance with the objects of this invention a new method of removing the polymeric scum from the surface of an etched-back spin-on glass layer is achieved. The surface of the etched-back spin-on glass layer is exposed to a gas discharge plasma of nitrous oxide or nitrogen. This effectively removes the polymeric scum eliminating subsequent possible peeling and blistering problems without increasing the moisture absorption capacity of the spin-on glass layer.

DESCRIPTION OF THE PREFERRED EMBODIMENTS

Figure 1:
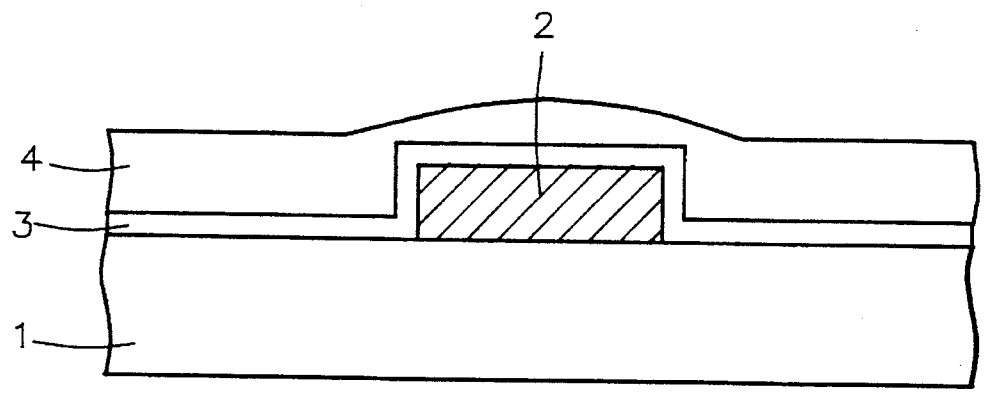
FIG. 1 shows a cross-section of a partially completed integrated circuit that has been covered with a layer of SOG.

Referring now to FIG. 1, there is shown there a cross-section through a partially completed integrated circuit 1. A metal layer 2 (which has been etched into the shape of a line and shown edge on) has been deposited on the surface of 1. This has been followed by a layer of oxide deposited through plasma enhanced chemical vapor deposition (PE oxide). Said PE oxide covers both the metal layer 2 and the main body of the integrated circuit 1. As can be seen, the metal layer 2 protrudes above the plane of the main surface making for unevenness or non-planarity. Such non-planarity will reduce the accuracy and alignment of masks that have yet to be used to complete the manufacture of the integrated circuit.

In order to restore the surface of the integrated circuit to a condition of planarity it has been coated with a siloxane solution which, after drying, was heated in nitrogen at a temperature of 420° C. for 30 minutes. This process converted the siloxane layer to a silicon dioxide, or spin-on glass (SOG), layer. The thickness of the original siloxane layer was chosen so that the resulting SOG was thick enough to fully cover metal layer 2 (and any others like it on the surface of 1), creating a surface for the integrated circuit that is now close to planar again.

The SOG coating either filled in the concave portions of the surface or lay above the metal layer. The appearance of the structure is therefore as shown in FIG. 1.

The excess SOG was now be etched back to the level of layer 3, to remove the SOG that remained above the metal layer, so as to achieve better electrical stability and performance. This was accomplished by using a standard etchant such as, for example, $CF_4/CHF_3$. After the desired degree of etch-back had been achieved the structure now had the appearance shown in FIG. 2.

Figure 2:
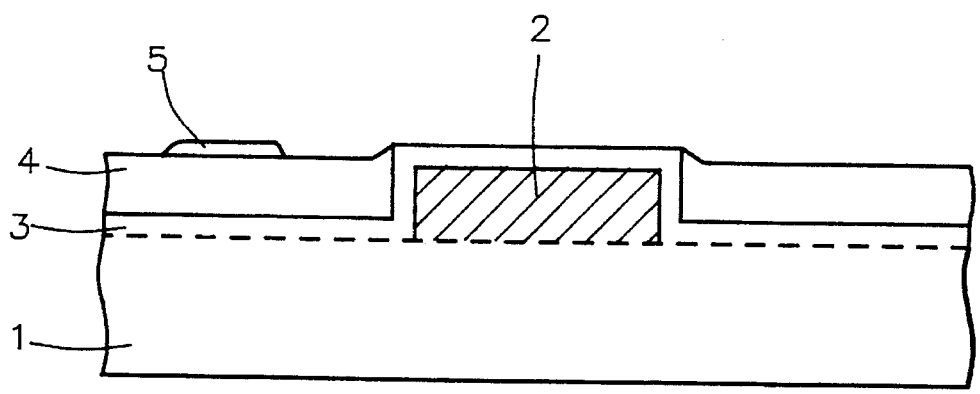
FIG. 2 shows that a polymeric residue has formed on the surface of the SOG after it has been etched back.

Also shown in FIG. 2 is an area 5 which is meant to represent a layer of polymer formed as a result of chemical reaction between the $CF_4/CHF_3$ etchant and free radicals of $CH_3$ that were left behind inside the SOG during the conversion of the siloxane to $SiO_2$. This layer of polymer is not a uniform coating on the SOG surface but is, rather, an irregular scum that forms on selected areas of the post etch surface in an unpredictable fashion. Unless this polymeric scum is removed, subsequently deposited layers will not adhere well to the surface of the SOG, giving rise to problems of blistering and peeling.

Figure 3:
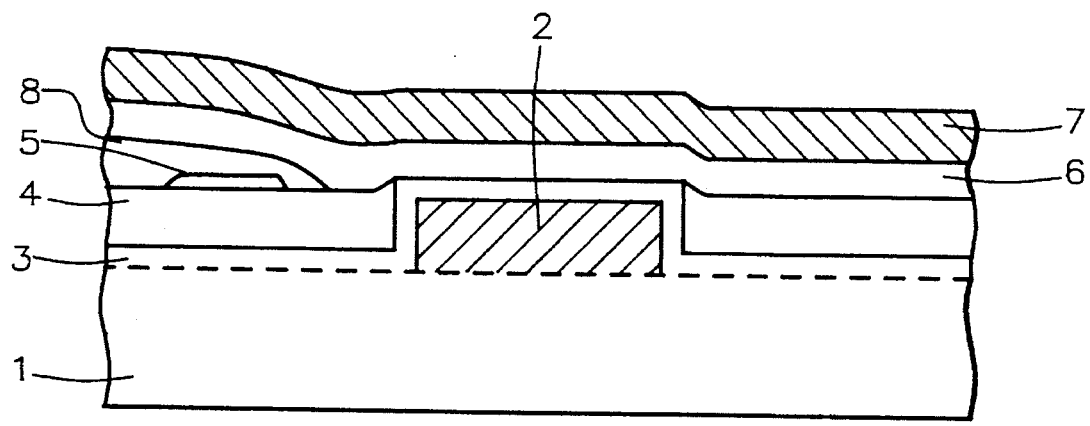
FIG. 3 illustrates how the presence of a polymeric residue on the surface of a SOG can cause subsequently deposited films to peel.

An example of peeling, if the polymeric scum is not removed, is illustrated in FIG. 3. The structure of FIG. 2 was coated with a layer of PE oxide 6 followed by an additional layer of metal 7. Because the scum 5 was not removed (in this example) adhesion between the second PE oxide layer 6 and the surface of the SOG 4 was poor so that the film 6 lost contact with the surface of 4 leaving behind a void, or blister, 8.

Figure 4:
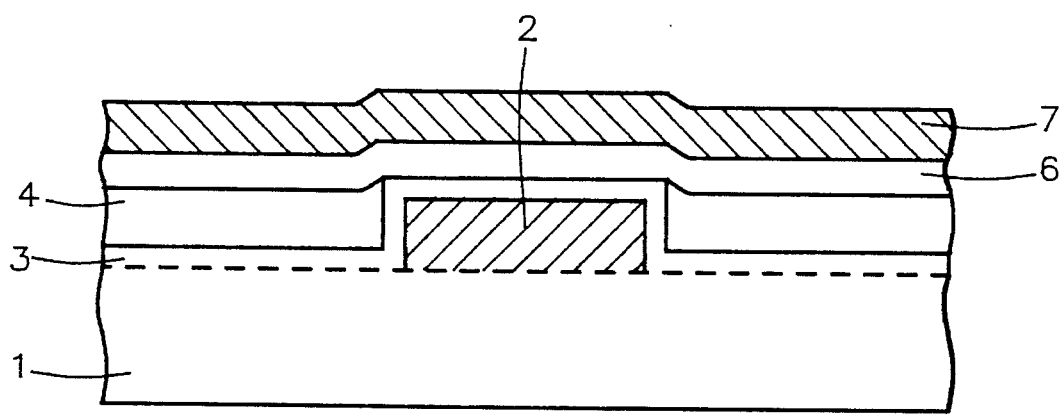
FIG. 4 represents a cross-section of several films deposited on the surface of a SOG that has been treated according to the method described by this invention.

In order to achieve the end result illustrated in FIG. 4 wherein the layers 6 and 7 adhere uniformly to the surface of SOG 4, it is essential to remove the polymeric scum deposits 5 (as exemplified in FIGS. 2 and 3). It should also be noted that removal of 5 needs to be accomplished without, at the same time, causing the integrity of SOG 4 to be degraded. In particular, the scum removal must be accomplished without introducing a level of porosity into the SOG. Such a side-effect of the scum removal process would increase the degree of moisture absorption by the SOG.

We have found the following method to be highly effective for the removal of the polymeric residue formed on the surface of the SOG after etch-back. The method has the important advantage of not affecting the moisture absorption properties of the SOG:

The surface of the SOG is exposed to a glow discharge (plasma) in nitrous oxide ($N_2O$) under the following conditions:

| | |
|---|---|
| duration | 15–45 seconds, preferably |
| pressure | 4.5–5.1 torr, preferably |
| RF power | 250–350 watts, preferably |
| temp. | 380–420° C., preferably |
| electrode spacing | 590–620 mils, preferably |
| gas flow | 1000–2200 sccm, preferably |

In a second embodiment of the invention, pure nitrogen gas is used as the ambient gas, under the same conditions as detailed above for nitrous oxide.

The following table shows the effectiveness of these two methods of scum removal when compared with current methods:

| Treatment | Amount of scum | Amount of moisture absorption |
|---|---|---|
| none | large | none |
| current practice | large | none |
| $N_2O$ | none | none |
| $N_2$ | none | none |
| high power $O_2$ | none | large |

While the invention has been particularly shown and described with reference to the preferred embodiments thereof, it will be understood by those skilled in the art that various changes in form and details may be Made without departing from the spirit and scope of the invention.

What is claimed is:

1. A method for treating the surface of a layer of a spin-on glass comprising:

subjecting said layer to an etchback treatment in a gaseous atmosphere containing compounds of carbon and fluorine; and exposing the surface of said etched back spin-on glass layer to an RF glow discharge between two electrodes in gas.

2. The method of claim 1 wherein the period of time during which the surface of said spin-on glass layer is exposed to said glow discharge is from 15 to 45 seconds.

3. The method of claim 1 wherein the pressure during said glow discharge treatment is from 4.5 to 5.1 torr.

4. The method of claim 1 wherein the RF power level is between 250 and 350 watts.

5. The method of claim 1 wherein the temperature at which said spin-on glass is maintained during said glow discharge treatment is between 380° C. and 420° C.

6. The method of claim 1 wherein the spacing between the electrodes is between 590 and 620 mils.

7. The method of claim 1 wherein the rate of flow of said $N_2O$ gas is controlled to be between 1,000 and 2,200 cubic centimeters per minute.

8. A method for treating the surface of a layer of a spin-on glass comprising:

subjecting said layer to an etchback treatment in a gaseous atmosphere containing compounds of carbon and fluorine: and exposing the surface of said etched back spin-on glass layer to an RF glow discharge between two electrodes in $N_2O$ gas.

9. The method of claim 8 wherein the period of time during which the surface of said spin-on glass layer is exposed to said glow discharge is from 15 to 45 seconds.

10. The method of claim 8 wherein the pressure during said glow discharge treatment is from 4.5 to 5.1 torr.

11. The method of claim 8 wherein the RF power level is between 250 and 350 watts.

12. The method of claim 8 wherein the temperature at which said spin-on glass is maintained during said glow discharge treatment is between 380° C. and 420° C.

13. The method of claim 8 wherein the spacing between the electrodes is between 590 and 620 mils.

14. The method of claim 8 wherein the rate of flow of said $N_2O$ gas is controlled to be between 1,000 and 2,200 cubic centimeters per minute.

15. A method for manufacturing an integrated circuit comprising:

provding a silicon substrate with layers of conductive and insulating material, etched into patterns;

planarizing said integrated circuit by means of a layer of a spin-on glass;

etching back said layer of spin-on glass so as to just remove it from the surface of said conductive material and;

exposing the surface of said etched-back spin-on glass layer to a glow discharge between two electrodes in nitrous oxide ($N_2O$).

16. The method of claim 15 wherein the period of time during which the surface of said spin-on glass layer is exposed to said glow discharge is from 15 to 45 seconds.

17. The method of claim 15 wherein the pressure during said glow discharge treatment is from 4.5 to 5.1 torr.

18. The method of claim 15 wherein the RF power level is between 250 and 350 watts.

19. The method of claim 15 wherein the temperature at which said spin-on glass is maintained during said glow discharge treatment is between 380° C. and 420° C.

20. The method of claim 15 wherein the spacing between the electrodes is between 590 and 620 mils.

21. The method of claim 15 wherein the rate of flow of said $N_2O$ gas is controlled to be between 1,000 and 2,200 cubic centimeters per minute.

22. A method for manufacturing an integrated circuit comprising:

providing a silicon substrate with layers of conductive and insulating material, etched into patterns;

planarizing said integrated circuit by means of a layer of a spin-on glass;

etching back said layer of spin-on glass so as to just remove it from the surface of said conductive material and;

exposing the surface of said etched-back spin-on glass layer to a glow discharge between two electrodes in $N_2O$ gas.

23. The method of claim 22 wherein the period of time during which the surface of said spin-on glass layer is exposed to said glow discharge is from 15 to 45 seconds.

24. The method of claim 22 wherein the pressure during said glow discharge treatment is from 4.5 to 5.1 torr.

25. The method of claim 22 wherein the RF power level is between 250 and 350 watts.

26. The method of claim 22 wherein the temperature at which said spin-on glass is maintained during said glow discharge treatment is between 380° C. and 420° C.

27. The method of claim 22 wherein the spacing between the electrodes is between 590 and 620 mils.

28. The method of claim 22 wherein the rate of flow of said $N_2O$ gas is controlled to be between 1,000 and 2,200 cubic centimeters per minute.

* * * * *